United States Patent
Wang et al.

(10) Patent No.: US 10,818,631 B2
(45) Date of Patent: Oct. 27, 2020

(54) SEMICONDUCTOR STRUCTURE AND METHOD OF FORMING THE SAME

(71) Applicant: Yangtze Memory Technologies Co., Ltd., Wuhan, Hubei Province (CN)

(72) Inventors: Xinsheng Wang, Wuhan (CN); Li Zhang, Wuhan (CN); Gaosheng Zhang, Wuhan (CN); Xianjin Wan, Wuhan (CN); Ziqun Hua, Wuhan (CN); Jiawen Wang, Wuhan (CN); Taotao Ding, Wuhan (CN); Hongbin Zhu, Wuhan (CN); Weihua Cheng, Wuhan (CN); Shining Yang, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

(21) Appl. No.: 16/377,244

(22) Filed: Apr. 7, 2019

(65) Prior Publication Data
US 2020/0006278 A1    Jan. 2, 2020

Related U.S. Application Data

(63) Continuation of application No. PCT/CN2018/093694, filed on Jun. 29, 2018.

(51) Int. Cl.
*H01L 23/52* (2006.01)
*H01L 23/00* (2006.01)
*H01L 23/532* (2006.01)

(52) U.S. Cl.
CPC .......... *H01L 24/33* (2013.01); *H01L 23/5329* (2013.01); *H01L 24/09* (2013.01); *H01L 24/27* (2013.01); *H01L 2224/335* (2013.01)

(58) Field of Classification Search
CPC ..... H01L 23/5329; H01L 24/09; H01L 24/27; H01L 24/33
USPC .......................................................... 257/734
See application file for complete search history.

(56) References Cited

U.S. PATENT DOCUMENTS

| 5,782,975 A   | 7/1998  | Linn |
|---------------|---------|------|
| 9,653,623 B2* | 5/2017  | Hong .................... H01L 31/103 |

FOREIGN PATENT DOCUMENTS

CN         103839800 A  *  6/2014

* cited by examiner

Primary Examiner — Luan C Thai
(74) Attorney, Agent, or Firm — Winston Hsu

(57) ABSTRACT

A semiconductor structure and a method of forming the same are provided. The semiconductor structure includes a first substrate; a first adhesive layer disposed on the surface of the first substrate; a first buffer layer disposed on the surface of the first adhesive layer; and a first bonding layer disposed on the surface of the first buffer layer, wherein the densities of the first adhesive layer and the first buffer layer are greater than that of the first bonding layer. The first adhesive layer of the semiconductor structure has higher adhesion with the first substrate and the first buffer layer, and the first buffer layer and the first bonding layer exhibit higher adhesion, which are beneficial to improve the performance of the semiconductor structure.

16 Claims, 3 Drawing Sheets

SEMICONDUCTOR STRUCTURE AND METHOD OF FORMING THE SAME

CROSS REFERENCE TO RELATED APPLICATIONS

The present application is a continuation of International Application No. PCT/CN2018/093694 filed on Jun. 29, 2018. The present application is based on and claims priority to International Application PCT/CN2018/093694 filed on Jun. 29, 2018, the contents of which are hereby incorporated by reference in their entirety.

BACKGROUND OF THE INVENTION

1. Field of the Invention

This invention relates to the technical field of semiconductors, and more particularly, to a semiconductor structure and a method of forming the same.

2. Description of the Prior Art

In three dimensional (3D) chip technology platforms, two or more wafers with semiconductor devices formed thereon are usually bonded by wafer bonding technology to improve the integration of chips. In the existing wafer bonding technology, a bonding film is formed on the bonding surface of the wafer, and the wafer bonding between the two layers of wafers is realized by the surface bonding of the bonding film.

In the prior art, silicon oxide and silicon nitride films are usually used as bonding films. The bonding strength is insufficient, however, and defects are easily introduced during the process, which affects the product yield.

A metal connection structure is also formed in the bonding film. In the process of hybrid bonding, the diffusion of the metal connection structure easily occurs at the bonding interface, which affects the product's performance.

Therefore, improving the quality of wafer bonding has become an urgent problem in this field.

SUMMARY OF THE INVENTION

The technical problem to be solved by this invention is improving the bonding quality by providing a semiconductor structure and a method of forming the same.

In order to solve the problems in the related arts, this invention provides a semiconductor structure including a first substrate, a first adhesive layer disposed on a surface of the first substrate, a first buffer layer disposed on a surface of the first adhesive layer, and a first bonding layer disposed on a surface of the first buffer layer. A density of the first adhesive layer and a density of the first buffer layer are both greater than a density of the first bonding layer.

Optionally, a material of the first bonding layer and a material of the first buffer layer include a dielectric material including carbon, and an atomic concentration of carbon in the first bonding layer is greater than an atomic concentration of carbon in the first buffer layer.

Optionally, the atomic concentration of carbon in the first bonding layer is greater than 35%, and the atomic concentration of carbon in the first buffer layer is in a range from 0% to 50%.

Optionally, the atomic concentration of carbon in the first bonding layer is increased as a thickness of the first bonding layer is increased, and the atomic concentration of carbon in the first buffer layer is increased as a thickness of the first buffer layer is increased.

Optionally, a material of the first adhesive layer includes at least one of silicon nitride, silicon oxynitride, or silicon oxide.

Optionally, the material of the first bonding layer further includes silicon and nitrogen.

Optionally, the material of the first buffer layer further includes silicon and nitrogen.

Optionally, a thickness of the first adhesive layer is in a range from 30 angstroms (Å) to 100 Å, and a thickness of the first buffer layer is in a range from 50 Å to 100 Å.

Optionally, the semiconductor structure further includes a second substrate, a second adhesive layer formed on the surface of the second substrate, a second buffer layer disposed on the surface of the second adhesive layer, and a second bonding layer disposed on the surface of the second buffer layer. A density of the second adhesive layer and a density of the second buffer layer are both greater than a density of the second bonding layer, and the second bonding layer is bonded and fixed to a surface of the first bonding layer correspondingly.

Optionally, a material of the second bonding layer and a material of the first bonding layer are the same, a material of the second buffer layer and a material of the first buffer layer are the same, and a material of the second adhesive layer and a material of the first adhesive layer are the same.

Optionally, the semiconductor structure further includes a plurality of first bonding pads penetrating through the first bonding layer, the first buffer layer, and the first adhesive layer and a plurality of second bonding pads penetrating through the second bonding layer, the second buffer layer, and the second adhesive layer. The first bonding pads are bonded and connected to the second bonding pads.

In order to solve the above problem, an embodiment of this invention further provides a method of forming a semiconductor structure including: providing a first substrate; forming a first adhesive layer on a surface of the first substrate; performing a plasma bombardment process on the first adhesive layer to increase a density of the first adhesive layer; forming a first buffer layer on a surface of the first adhesive layer; and forming a first bonding layer on a surface of the first buffer layer, wherein a density of the first adhesive layer and a density of the first buffer layer are both greater than a density of the first bonding layer.

Optionally, the first adhesive layer includes a plurality of hydrogen bonds before performing the plasma bombardment process, and a nitrogen-containing plasma is used in the plasma bombardment process to reduce the hydrogen bonds in the first adhesive layer.

Optionally, a material of the first bonding layer and a material of the first buffer layer include a dielectric material including carbon, and an atomic concentration of carbon in the first bonding layer is greater than an atomic concentration of carbon in the first buffer layer.

Optionally, the material of the first bonding layer further includes silicon and nitrogen.

Optionally, the material of the first buffer layer further includes silicon and nitrogen.

Optionally, a material of the first adhesive layer includes at least one of silicon nitride, silicon oxynitride, or silicon oxide.

Optionally, a thickness of the first adhesive layer is in a range from 30 Å to 100 Å, and a thickness of the first buffer layer is in a range from 50 Å to 100 Å.

In the semiconductor structure of this invention, the first adhesive layer and the first buffer layer are included between the first substrate and the first bonding layer. The density of the first adhesive layer and the density of the first buffer layer are both greater than the density of the first bonding layer. The adhesion between the first adhesive layer and the first substrate, the adhesion between the first adhesive layer and the first buffer layer, and the adhesion between the first buffer layer and the first bonding layer can be increased, and problems such as breakage can thereby be avoided. Additionally, the first bonding layer can have strong bonding force at the bonding surface after it is bonded, and the first bonding layer can block the diffusion of metallic materials at the bonding interface, thereby improving the performance of the semiconductor structure.

DETAILED DESCRIPTION

A semiconductor structure and a method of forming the same provided by this invention may be understood by reference to the following detailed description, taken in conjunction with the drawings as described below.

FIG. 1 to FIG. 4 schematically illustrate structures in the processes of forming a semiconductor structure according to an embodiment of this invention.

Figure 1:
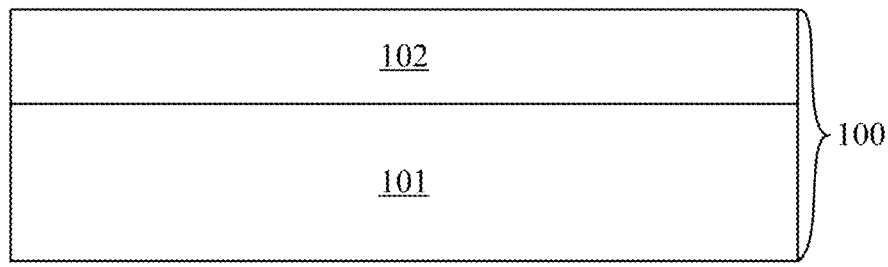
FIG. 1 to FIG. 4 schematically illustrate structures in the processes of forming a semiconductor structure according to an embodiment of this invention.

Referring to FIG. 1, a first substrate 100 is provided.

The first substrate 100 includes a first semiconductor substrate 101 and a first device layer 102 formed on the surface of the first semiconductor substrate 101.

The first semiconductor substrate 101 may be a single crystalline silicon substrate, a germanium substrate, a silicon germanium substrate, a silicon on insulator (SOI), a germanium on insulator (GOI), etc. According to the actual requirements of the device, a suitable first semiconductor substrate 101 can be used, and is not limited herein. In this embodiment, the first semiconductor substrate 101 is a single crystalline silicon.

The first device layer 102 includes semiconductor devices formed on the first semiconductor substrate 101, a metal interconnection structure connecting the semiconductor devices, and a dielectric layer covering the semiconductor devices and the metal interconnection structure, etc. The dielectric layer is typically silicon oxide, silicon nitride, or silicon oxynitride. The first device layer 102 can be a multi-layer or single-layer structure. In one embodiment, the first device layer 102 includes the dielectric layer and a 3D NAND structure formed in the dielectric layer.

Figure 2:
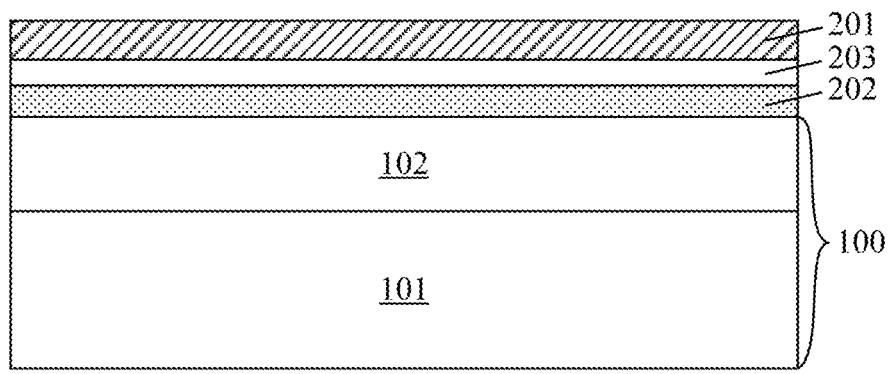

Referring to FIG. 2, a first adhesive layer 202, a first buffer layer 203, and a first bonding layer 201 are sequentially formed on the surface of the first substrate 100. The first buffer layer 203 is disposed on the surface of the first adhesive layer 202, and the first bonding layer 201 is disposed on the surface of the first buffer layer 203.

The first adhesive layer 202, the first buffer layer 203, and the first bonding layer 201 can be sequentially formed by the chemical vapor deposition process (CVD). In this embodiment, the plasma-enhanced chemical vapor deposition (PECVD) process is used to form the first adhesive layer 202, the first buffer layer 203, and the first bonding layer 201.

The material of the first adhesive layer 202 is the dielectric material, and the density of this material is greater than the density of the first bonding layer 201. The material of the first adhesive layer 202 can be at least one of silicon nitride, silicon oxynitride, or silicon oxide. According to the reactant gas used in the chemical vapor deposition process and the requirements of the specific product, at least one of oxygen, hydrogen, phosphorus, fluorine, or other elements may also be doped in the first adhesive layer 202.

In one embodiment, the material of the first adhesive layer 202 is silicon nitride, and the plasma-enhanced chemical vapor deposition process is used to form the first adhesive layer 202. The reactant gas used in the process includes silane (SiH4) and ammonia (NH3). The range of the flow ratio of the SiH4 and NH3 is (0.8-1.2):1, and the range of RF (radio frequency) power is in the range from 150 W to 300 W. The first adhesive layer 202 having higher density can be formed by adjusting the process parameters in the deposition process.

In other embodiments, the method of forming the first adhesive layer 202 includes using the deposition process to form an adhesive material layer on the surface of the first substrate 100, and performing a plasma bombardment process on the adhesive material layer to reduce the amount of hydrogen in the adhesive material layer and increase the density of the first adhesive layer 202 formed therefrom. Nitrogen-containing gas (e.g. N2, NH3) can be used in the plasma bombardment process. In one embodiment, N2 can be used as the plasma source of the plasma bombardment process, RF power is 500 W, and the bombardment time is 30 seconds. The hydrogen in the first adhesive layer 202 can be removed by the plasma bombardment process, thereby more chemical bonds (e.g. Si—, N—) that can connect the adjacent material layer can be included in the unit area of the first adhesive layer 202, and the adhesion between the first adhesive layer 202 and first device layer 102 and the adhesion between the first adhesive layer 202 and first buffer layer 203 can be enhanced.

The material of the first buffer layer 203 includes a dielectric material including carbon. In one embodiment, the first buffer layer 203 mainly includes silicon, nitrogen, and carbon. In other embodiments, the first buffer layer 203 can further include at least one of silicon, nitrogen, oxygen, hydrogen, phosphorus, fluorine, etc. according to the reactant gas used in the chemical vapor deposition process and the requirements of the specific product. The density of the first buffer layer 203 is greater than the density of the first bonding layer 201. In one embodiment, the density of the first buffer layer 203 is approximately equal to or the same as the density of the first adhesive layer 202. The material of the first buffer layer 203 can be carbon-doped silicon nitride, carbon-doped silicon oxynitride, nitrogen-doped silicon oxycarbide, etc. Since the density of the first buffer layer 203 is higher, the density of chemical bonds on the interface between the first buffer layer 203 and the first adhesive layer 202 is greater, and higher adhesion between the first buffer layer 203 and the first adhesive layer 202 can be obtained.

In one embodiment, the plasma-enhanced chemical vapor deposition process is used to form the first buffer layer 203. The reactant gas used in the plasma-enhanced chemical vapor deposition process includes NH3 and one of trimethylsilane or tetramethylsilane. The range of the flow ratio of trimethylsilane and NH3 (or tetramethylsilane and NH3) is 1:(2-4). The range of RF power is in the range from 200 W to 500 W. The density of the first buffer layer 203 and the atomic concentration of carbon in the first buffer layer 203 can be adjusted by adjusting the process parameters of the deposition process.

The material of the first bonding layer 201 includes a dielectric material including carbon, and the atomic concentration of carbon in the first bonding layer 201 is greater than the atomic concentration of carbon in the first buffer layer 203. In one embodiment, the first bonding layer 201 mainly includes silicon, nitrogen, and carbon. In other embodiments, the first bonding layer 201 can further include at least one of silicon, nitrogen, oxygen, hydrogen, phosphorus, fluorine, etc. according to the reactant gas used in the chemical vapor deposition process and the requirements of the specific product. The material of the first bonding layer 201 can be carbon-doped silicon nitride, carbon-doped silicon oxynitride, nitrogen-doped silicon oxycarbide, etc. The composition of the first bonding layer 201 is approximately equal to or the same as the composition of the first buffer layer 203. Therefore, higher adhesion between the first bonding layer 201 and the first buffer layer 203 can be obtained by forming the first bonding layer 201 on the surface of the first buffer layer 203. The adhesion between one material layer and the other material layer will decrease when the atomic concentration of carbon in the material layer is too high. Compared to the configuration of forming the first bonding layer 201 directly on the surface of the first adhesive layer 202, the adhesion between the first buffer layer 203 and the first adhesive layer 202 is higher when the atomic concentration of carbon in the first buffer layer 203 is less than the atomic concentration of carbon in the first bonding layer 201.

In one embodiment, the plasma-enhanced chemical vapor deposition process is used to form the first bonding layer 201. The reactant gas used in the plasma-enhanced chemical vapor deposition process includes NH3 and at least one of trimethylsilane or tetramethylsilane. The range of the flow ratio of trimethylsilane and NH3 (or tetramethylsilane and NH3) is (1.6-2.4):1. The range of RF power is in the range from 500 W to 1100 W.

Carbon in the first bonding layer 201 is capable of effectively increasing the bonding force between the first bonding layer 201 and the other bonding layer during the bonding process. The bonding force generated during the process of bonding the first bonding layer 201 and the other bonding layer is greater when the concentration of carbon is higher. In one embodiment, the atomic concentration of carbon in the first bonding layer 201 is greater than 35%.

Since the atomic concentration of carbon in the first buffer layer 203 is less than the atomic concentration of carbon in the first bonding layer 201, the material structure of the first buffer layer 203 is closer to the material structure of the first adhesive layer 202. In one embodiment, the atomic concentration of carbon in the first buffer layer 203 is in the range from 0% to 50%.

Since the concentration of carbon is higher in the first bonding layer 201, the density of the first bonding layer 201 is lower. In the embodiments of this application, the first adhesive layer 202 and the first buffer layer 203 having higher densities are formed between the first bonding layer 201 and the first substrate 100, and the atomic concentration of carbon in the first buffer layer 203 is less than the atomic concentration of carbon in the first bonding layer 201. Accordingly, the adhesion between different layers can be increased.

The concentrations of components in the first bonding layer 201 and the first adhesive layer 202 can be adjusted, and the adhesion between different material layers and the dielectric coefficient of each material layer can be adjusted by controlling the process parameters of the forming process of the first bonding layer 201, the first buffer layer 203, and the first adhesive layer 202.

Since the adhesion between different material layers corresponds to the material compositions on both sides of the interface, the adhesion will be stronger when the material compositions are closer. In order to further enhance the adhesion between the first adhesive layer 202 and the first device layer 102, the process parameters can be gradually adjusted during the process of forming the first adhesive layer 202. Accordingly, the concentrations of components in the first adhesive layer 202 can be gradually changed, and the material compositions on both sides of the interface between the first device layer 102 and the first adhesive layer 202 can be closer. In one embodiment, the atomic concentration of silicon in the first adhesive layer 202 is gradually changed as the thickness of the first adhesive layer 202 is increased, and this can be achieved by adjusting the process parameters of the deposition process when the thickness of the first adhesive layer 202 is increased during the process of forming the first adhesive layer 202. In other embodiments, the concentrations of other components in the first adhesive layer 202 can also be adjusted according to the material of the surface of the first device layer 102. In other embodiments, the process parameters of the deposition process can also be unchanged during the process of forming the first adhesive layer 202 to keep the atomic concentration of each element in the first adhesive layer 202 consistent at positions of different thicknesses.

In order to further enhance the adhesion between the first adhesive layer 202 and the first buffer layer 203, the process parameters can be gradually adjusted during the process of forming the first buffer layer 203. Accordingly, the concentrations of components in the first buffer layer 203 can be gradually changed, and the material compositions on both sides of the interface between the first buffer layer 203 and the first adhesive layer 202 can be closer. In one embodiment, the atomic concentration of carbon in the first buffer layer 203 is gradually increased as the thickness of the first buffer layer 203 is increased, and this can be achieved by adjusting the process parameters of the deposition process when the thickness of the first buffer layer 203 is increased during the process of forming the first buffer layer 203. In other embodiments, the atomic concentration of carbon in the first buffer layer 203 can also be gradually decreased as the thickness of the first buffer layer 203 is increased, or the atomic concentration of carbon in the first buffer layer 203 can be gradually increased first and gradually decreased later as the thickness of the first buffer layer 203 is increased. In other embodiments, the process parameters of the deposition process are unchanged during the process of forming the first buffer layer 203 to keep the atomic concentration of each element in the first buffer layer 203 consistent at positions of different thicknesses.

In order to further enhance the adhesion between the first buffer layer 203 and the first bonding layer 201, the process parameters can be gradually adjusted during the process of forming the first buffer layer 203. Accordingly, the concentrations of components in the first bonding layer 201 can be gradually changed, and the material compositions on both sides of the interface between the first bonding layer 201 and the first buffer layer 203 can be closer. In one embodiment, the atomic concentration of carbon in the first bonding layer 201 is gradually increased as the thickness of the first bonding layer 201 is increased, and this can be achieved by adjusting the process parameters of the deposition process when the thickness of the first bonding layer 201 is increased during the process of forming the first bonding layer 201. In other embodiments, the atomic concentration of carbon in the first bonding layer 201 can also be gradually decreased as the thickness of the first bonding layer 201 is increased, or the atomic concentration of carbon in the first bonding layer 201 can be gradually increased first and gradually decreased later as the thickness of the first bonding layer 201 is increased. In other embodiments, the process parameters of the deposition process are unchanged during the process of forming the first bonding layer 201 to keep the atomic concentration of each element in the first bonding layer 201 consistent at positions of different thicknesses.

In order to make the first adhesive layer 202 and the first buffer layer 203 have higher densities at positions of different thicknesses (specifically, in order to reduce hydrogen in the first adhesive layer 202 as much as possible in the plasma bombardment process of forming the first adhesive layer 202, and to improve the densities at positions of different thicknesses of the first adhesive layer 202), the thickness of the first adhesive layer 202 cannot be too large. In one embodiment, the thickness of the first adhesive layer 202 is in the range from 30 angstroms (Å) to 100 Å, and the thickness of the first buffer layer 203 is in the range from 50 Å to 100 Å.

In some embodiments, the thickness of the first bonding layer 201 is greater than the thickness of the first adhesive layer 202 and the thickness of the first buffer layer 203. This ensures that the first bonding layer 201 has sufficient bonding thickness when the first bonding layer 201 is being bonded to other bonding layers. In one embodiment, the thickness of the first bonding layer 201 is greater than 100 Å.

In other embodiments, the first bonding layer 201 can further include two or more stacked sub-bonding layers. The materials of different sub-bonding layers may be the same or different.

In the semiconductor structure of the aforementioned embodiment, the first adhesive layer and the first buffer layer are included between the first substrate and the first bonding layer. The density of the first adhesive layer and the density of the first buffer layer are both greater than the density of the first bonding layer, the adhesion between the first adhesive layer and the first substrate and the adhesion between the first buffer layer and the first bonding layer are therefore increased. In addition, both of the first buffer layer and the first adhesive layer have higher densities, the higher adhesion between the first buffer layer and the first adhesive layer can be obtained, and problems such as breakage of the semiconductor structure and the like can be avoided. Also, the first bonding layer can have strong bonding force at the bonding surface after it is bonded, and the first bonding layer can block the diffusion of metallic materials at the bonding interface, thereby improving the performance of the semiconductor structure formed therefrom.

Figure 3:
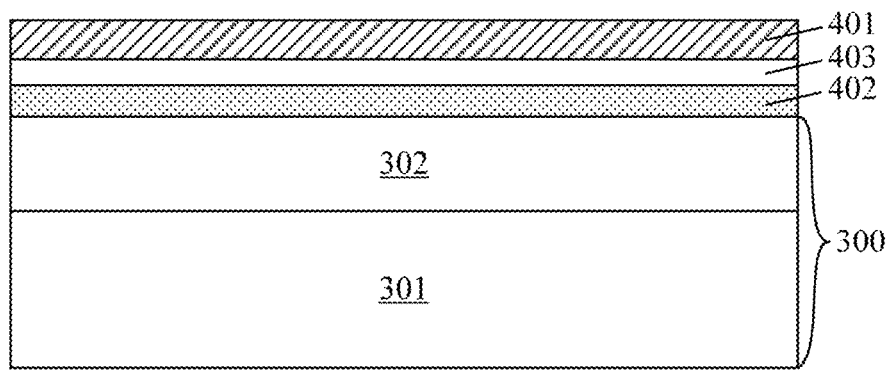

Referring to FIG. 3, in another embodiment, the method of forming the semiconductor structure further includes providing a second substrate 300 and forming a second adhesive layer 402, second buffer layer 403, and a second bonding layer 401. The second adhesive layer 402 is formed on the surface of the second substrate 300, the second buffer layer 403 is disposed on the surface of the second adhesive layer 402, and the second bonding layer 401 is disposed on the surface of the second buffer layer 403.

The second substrate 300 includes a second semiconductor substrate 301 and a second device layer 302 disposed on the surface of the second semiconductor substrate 301.

The material of the second adhesive layer 402 is the dielectric material, and the density of this material is greater than the density of the second bonding layer 401. The material of the second adhesive layer 402 can be at least one of silicon nitride, silicon oxynitride, or silicon oxide. According to the reactant gas used in the chemical vapor deposition process and the requirements of the specific product, at least one of oxygen, hydrogen, phosphorus, fluorine, or other elements may also be included in the second adhesive layer 402.

The material of the second buffer layer 403 is the dielectric material, and the density of this material is greater than the density of the second bonding layer 401. The material of the second buffer layer 403 includes the dielectric material including carbon. In one embodiment, the second buffer layer 403 mainly includes silicon, nitrogen, and carbon. In other embodiments, the second buffer layer 403 can further include at least one of silicon, nitrogen, oxygen, hydrogen, phosphorus, fluorine, etc. according to the reactant gas used in the chemical vapor deposition process and the requirements of the specific product.

The material of the second bonding layer 401 includes a dielectric material including carbon, and the atomic concentration of carbon in the second bonding layer 401 is greater than the atomic concentration of carbon in the second buffer layer 403. In one embodiment, the second bonding layer 401 mainly includes silicon, nitrogen, and carbon. In other embodiments, the second bonding layer 401 can further include at least one of silicon, nitrogen, oxygen, hydrogen, phosphorus, fluorine, etc. according to the reactant gas used in the chemical vapor deposition process and the requirements of the specific product. The adhesion between one material layer and the other material layer will decrease when the atomic concentration of carbon in the material layer is too high. Compared to the configuration of forming the second bonding layer 401 directly on the surface of the second adhesive layer 402, the adhesion between the second buffer layer 403 and the second adhesive layer 402 is higher when the atomic concentration of carbon in the second buffer layer 403 is less than the atomic concentration of carbon in the second bonding layer 401.

The chemical vapor deposition process is used to sequentially form the second adhesive layer 402, the second buffer layer 403, and the second bonding layer 401 on the surface of the second device layer 302. The specific materials, structures, and forming methods of the second adhesive layer 402, the second buffer layer 403, and the second bonding layer 401 can be known by referring to the description of the first adhesive layer 202, the first buffer layer 203, and the first bonding layer 201 in the above embodiments, and will not be repeated here. In one embodiment, the materials, the structures, and the forming methods of the second adhesive layer 402 and the first adhesive layer 202 are the same, the materials, the structures, and the forming methods of the second buffer layer 403 and the first buffer layer 203 are the same, and the materials, the structures, and the forming methods of the second bonding layer 401 and the first bonding layer 201 are the same.

In one embodiment, the thickness of the second adhesive layer 402 is in the range from 30 Å to 100 Å, the thickness of the second buffer layer 403 is in the range from 50 Å to 100 Å, and the thickness of the second bonding layer 401 is greater than 100 Å.

Figure 4:
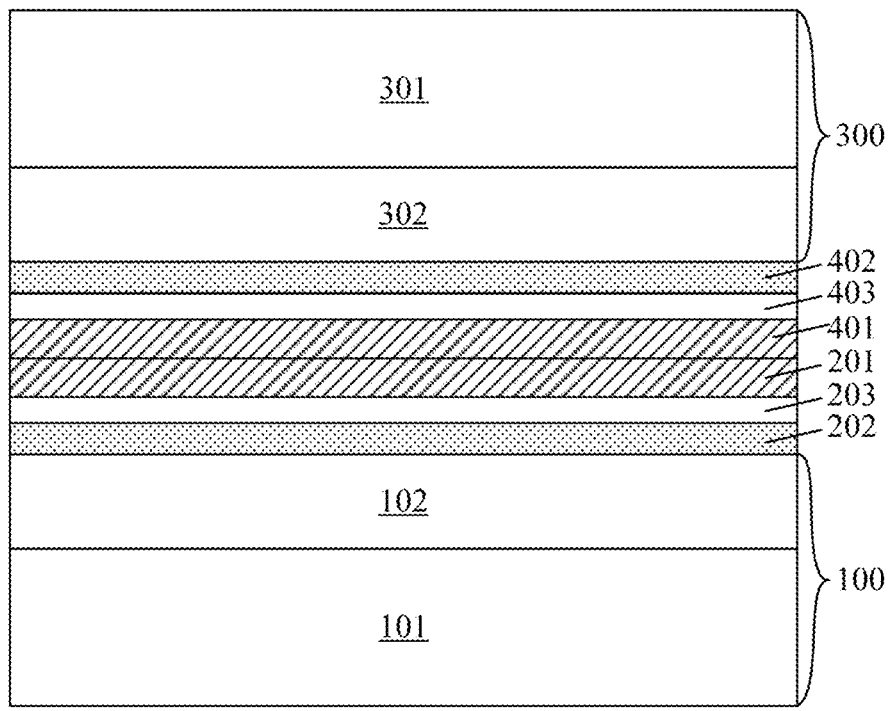

Referring to FIG. 4, the second bonding layer 401 is bonded and fixed to the surface of the first bonding layer 201 correspondingly.

The second bonding layer 401 and the first bonding layer 201 both include carbon. A portion of carbon is in the form of —CH3, which is more easily oxidized to —OH and forms Si—O bonds during the bonding process. Therefore, more silicon-oxygen bonds can be formed on the bonding interface, and the stronger bonding force can be formed as well. In one embodiment, the bonding force between the second bonding layer 401 and the first bonding layer 201 is greater than 2 J/M2. In the conventional method, the bonding layer that does not include carbon is used for bonding, and the bonding force is usually less than 1.5 J/M2.

In one embodiment, the first substrate 100 is a substrate on which the 3D NAND memory structure is formed, and the second substrate 200 is a substrate on which peripheral circuits are formed.

In other embodiments, the above adhesive layer and bonding layer can also be formed on surfaces of both side of the substrate to achieve the multi-layer bonding.

Figure 5:
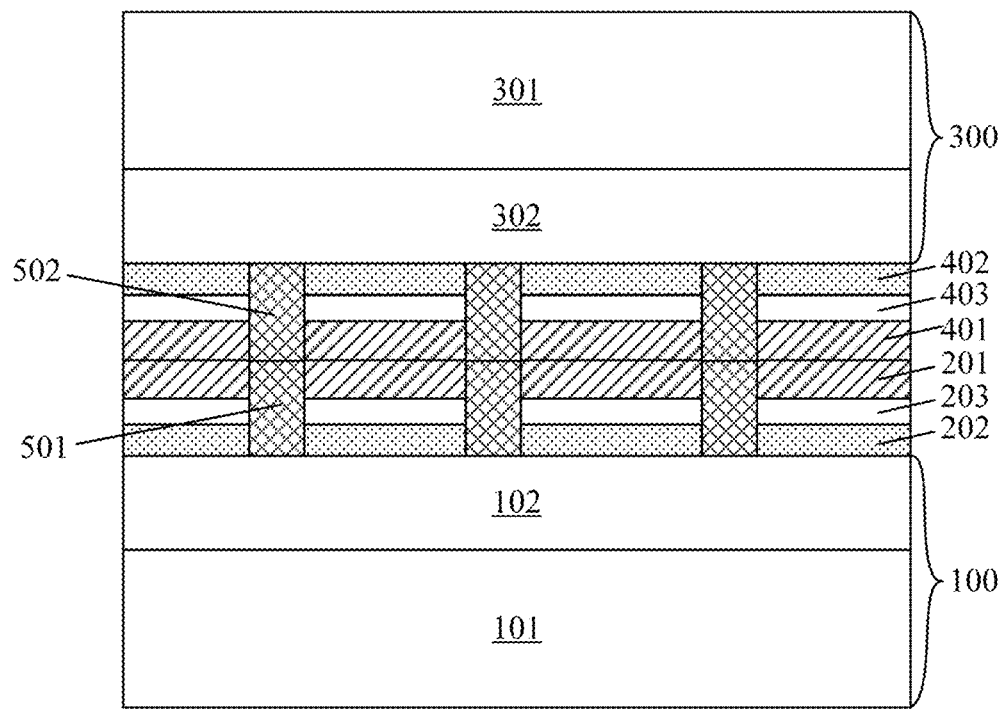
FIG. 5 schematically illustrates a structure of a semiconductor structure according to an embodiment of this invention.

Referring to FIG. 5, in another embodiment, the method of forming the semiconductor structure further includes forming a plurality of first bonding pads 501 penetrating through the first bonding layer 201, the first buffer layer 203, and the first adhesive layer 202 and forming a plurality of second bonding pads 502 penetrating through the second bonding layer 401, the second buffer layer 403, and the second adhesive layer 402. The first bonding pads 501 are bonded to the second bonding pads 502 correspondingly when the surface of the second bonding layer 401 is bonded and fixed to the surface of the first bonding layer 201 correspondingly.

The first bonding pads 501 and the second bonding pads 502 can be respectively connected to the semiconductor devices and the metal interconnection structures in the first device layer 102 and the second device layer 302.

The method of forming the first bonding pads 501 includes the following steps. A patterning process is performed to the first bonding layer 201, the first buffer layer 203, and the first adhesive layer 202 to form openings penetrating through the first bonding layer 201, the first buffer layer 203, and the first adhesive layer 202. The metallic material is filled in the openings and the planarization process is performed to form the first bonding pads 501 filling the openings. The same method is used to form the second bonding pads 502 in the second bonding layer 401, the second buffer layer 403, and the second adhesive layer 402. The electrical connection between the semiconductor devices in the first device layer 102 and the second device layer 302 can be achieved by bonding the first bonding pads 501 and the second bonding pads 502.

The materials of the first bonding pads 501 and the second bonding pads 502 may be copper, tungsten, or other metallic materials. The first bonding layer 201 and the second bonding layer 401 include carbon, which is capable of effectively blocking the diffusion of the materials of the first bonding pads 501 and the second bonding pads 502 at the bonding interface, thereby improving the performance of the semiconductor structure.

In the aforementioned embodiments, the adhesive layer is formed on the surface of the substrate, the buffer layer is formed on the surface of the adhesive layer, and then the bonding layer is formed on the surface of the buffer layer. The density of the adhesive layer and the density of the buffer layer are both greater than the density of the bonding layer. Accordingly, the adhesion between the adhesive layer and the substrate and the adhesion between the buffer layer and the bonding layer are increased. Also, the bonding layer can have the strong bonding force at the bonding surface after it is bonded, which is capable of blocking the diffusion of metallic materials at the bonding interface, thereby improving the performance of the semiconductor structure formed therefrom.

The method of forming the semiconductor structure in the aforementioned embodiments can also be used for bonding a plurality of substrates.

Figure 6:
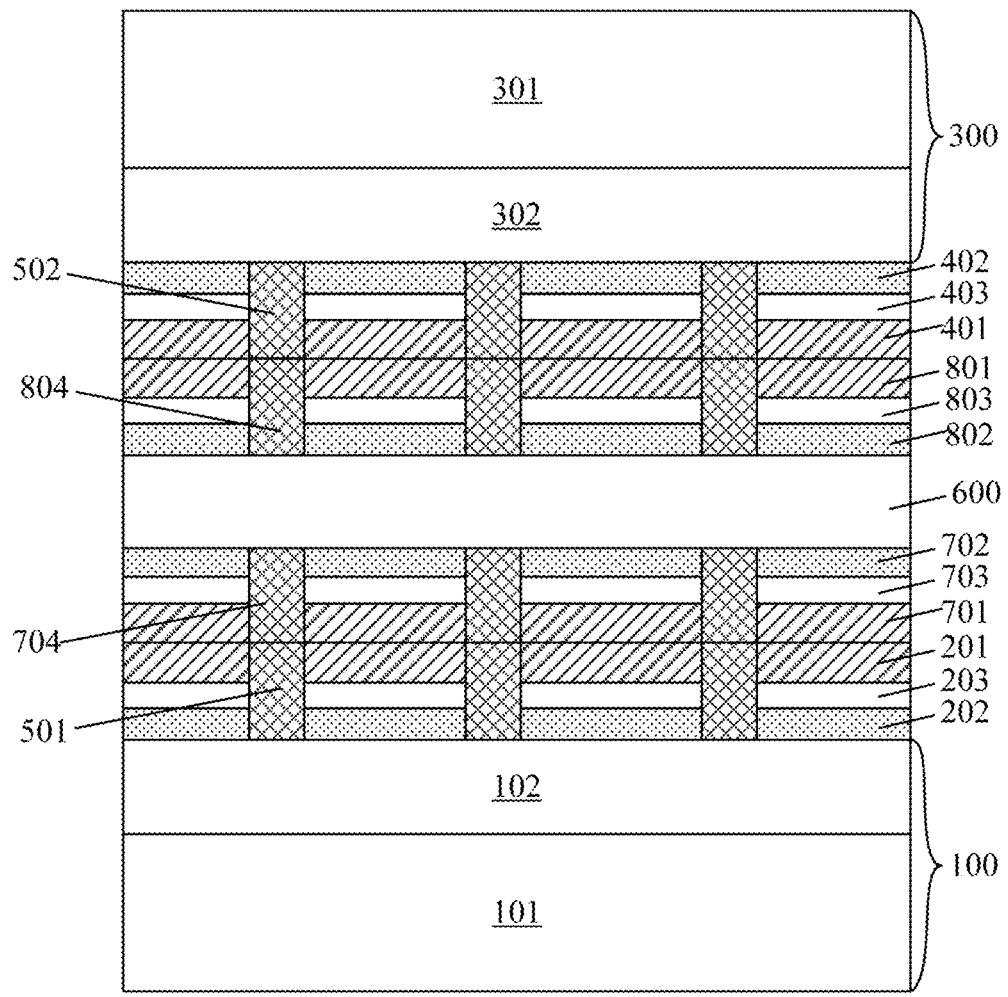
FIG. 6 schematically illustrates a structure of a semiconductor structure according to an embodiment of this invention.

Referring to FIG. 6, in one embodiment of this invention, the method of forming the semiconductor structure further includes following steps. A third substrate 600 is provided. A third adhesive layer 702, a third buffer layer 703, and a third bonding layer 701 are sequentially formed on the surface of one side of the third substrate 600. A fourth adhesive layer 802, a fourth buffer layer 803, and a fourth bonding layer 801 are sequentially formed on the opposite surface of another side of the third substrate 600. The third bonding layer 701 is bonded and fixed to the surface of the first bonding layer 201 correspondingly, and the fourth bonding layer 801 is bonded and fixed to the surface of the second bonding layer 401 correspondingly to form the three-layer bonded structure.

The materials, structures, and forming methods of the third adhesive layer 702 and the fourth adhesive layer 802, the materials, structures, and forming methods of the third buffer layer 703 and the fourth buffer layer 803, and the materials, structures, and forming methods of the third bonding layer 701 and the fourth bonding layer 801 can be known by referring to the materials, structures, and forming methods of the first adhesive layer 202, the first buffer layer 203, and the first bonding layer 201 in the aforementioned embodiments. These materials, structures, and the forming methods will not be described here.

In this embodiment, the method of forming the semiconductor structure further includes forming a plurality of third bonding pads 704 penetrating through the third bonding layer 701, the third buffer layer 703, and the third adhesive layer 702, and forming a plurality of fourth bonding pads 804 penetrating through the fourth bonding layer 801, the fourth buffer layer 803, and the fourth adhesive layer 802. The third bonding pads 704 are bonded and connected to the first bonding pads 501, and the fourth bonding pads 804 are bonded and connected to the second bonding pads 502.

In other embodiments, the aforementioned method can also be used for forming a bonded structure including four or more layers.

It is noteworthy that the type of the semiconductor device in each substrate is not limited to the embodiments in the technical schemes of this invention. In addition to 3D NAND, the semiconductor device may be CMOS circuit, CIS circuit, TFT circuit, etc.

An embodiment of this invention further provides a semiconductor structure.

FIG. 2 schematically illustrates the structure of the semiconductor structure of an embodiment of this invention.

The semiconductor structure includes the first substrate 100, the first adhesive layer 202, the first buffer layer 203, and the first bonding layer 201. The first adhesive layer 202 is disposed on the surface of the first substrate 100, the first buffer layer 203 is disposed on the surface of the first adhesive layer 202, and the first bonding layer 201 is disposed on the surface of the first buffer layer 203.

The first substrate 100 includes the first semiconductor substrate 101 and the first device layer 102 formed on the surface of the first semiconductor substrate 101.

The first semiconductor substrate 101 may be a single crystalline silicon substrate, a germanium substrate, a silicon germanium substrate, a silicon on insulator (SOI), a germanium on insulator (GOI), etc. According to the actual requirements of the device, a suitable first semiconductor substrate 101 can be used, and is not limited herein. In this embodiment, the first semiconductor substrate 101 is a single crystalline silicon.

The first device layer 102 includes semiconductor devices formed on the first semiconductor substrate 101, the metal interconnection structure connecting the semiconductor devices, the dielectric layer covering the semiconductor devices and the metal interconnection structure, etc. The first device layer 102 can be a multi-layer or single-layer structure. In one embodiment, the first device layer 102 includes the dielectric layer and the 3D NAND structure formed in the dielectric layer.

The material of the first adhesive layer 202 is the dielectric material, and the density of this material is greater than the density of the first bonding layer 201. The material of the first adhesive layer 202 can be at least one of silicon nitride, silicon oxynitride, or silicon oxide. According to the reactant gas used in the chemical vapor deposition process and the requirements of the specific product, at least one of oxygen, hydrogen, phosphorus, fluorine, or other elements may also be doped in the first adhesive layer 202. In one embodiment, the material of the first adhesive layer 202 is silicon nitride which has the high density.

The material of the first buffer layer 203 includes a dielectric material including carbon. In one embodiment, the first buffer layer 203 mainly includes silicon, nitrogen, and carbon. In other embodiments, the first buffer layer 203 can further include at least one of silicon, nitrogen, oxygen, hydrogen, phosphorus, fluorine, etc. according to the reactant gas used in the chemical vapor deposition process and the requirements of the specific product. In this embodiment, the density of the first buffer layer 203 is greater than the density of the first bonding layer 201, and the density of the first buffer layer 203 is approximately equal to or the same as the density of the first adhesive layer 202. The material of the first buffer layer 203 can be carbon-doped silicon nitride, carbon-doped silicon oxynitride, nitrogen-doped silicon oxycarbide, etc. Since the density of the first buffer layer 203 is higher, the density of chemical bonds on the interface between the first buffer layer 203 and the first adhesive layer 202 is greater, and higher adhesion between the first buffer layer 203 and the first adhesive layer 202 can be obtained.

The material of the first bonding layer 201 includes a dielectric material including carbon, and the atomic concentration of carbon in the first bonding layer 201 is greater than the atomic concentration of carbon in the first buffer layer 203. In one embodiment, the first bonding layer 201 mainly includes silicon, nitrogen, and carbon. In other embodiments, the first bonding layer 201 can further be doped with at least one of silicon, nitrogen, oxygen, hydrogen, phosphorus, fluorine, etc. according to the reactant gas used in the chemical vapor deposition process and the requirements of the specific product. The material of the first bonding layer 201 can be carbon-doped silicon nitride, carbon-doped silicon oxynitride, nitrogen-doped silicon oxycarbide, etc. The composition of the first bonding layer 201 is approximately equal to or the same as the composition of the first buffer layer 203. Therefore, the higher adhesion between the first bonding layer 201 and the first buffer layer 203 can be obtained by forming the first bonding layer 201 on the surface of the first buffer layer 203. The adhesion between one material layer and the other material layer will decrease when the atomic concentration of carbon in the material layer is too high. Compared to the configuration of forming the first bonding layer 201 directly on the surface of the first adhesive layer 202, the adhesion between the first buffer layer 203 and the first adhesive layer 202 is higher when the atomic concentration of carbon in the first buffer layer 203 is less than the atomic concentration of carbon in the first bonding layer 201.

Carbon in the first bonding layer 201 is capable of effectively increasing the bonding force between the first bonding layer 201 and the other bonding layer during the bonding process. The bonding force generated during the process of bonding the first bonding layer 201 and the other bonding layer is greater when the concentration of carbon is higher. In one embodiment, the atomic concentration of carbon in the first bonding layer 201 is greater than 35%.

Since the atomic concentration of carbon in the first buffer layer 203 is less than the atomic concentration of carbon in the first bonding layer 201, the material structure of the first buffer layer 203 is closer to the material structure of the first adhesive layer 202. In one embodiment, the atomic concentration of carbon in the first buffer layer 203 is in the range from 0% to 50%.

Since the concentration of carbon is higher in the first bonding layer 201, the density of the first bonding layer 201 is lower. In the embodiments of this application, the first adhesive layer 202 and the first buffer layer 203 having higher densities are formed between the first bonding layer 201 and the first substrate 100, and the atomic concentration of carbon in the first buffer layer 203 is less than the atomic concentration of carbon in the first bonding layer 201. Accordingly, the adhesion between different layers can be increased.

Since the adhesion between different material layers corresponds to the material compositions on both sides of the interface, the adhesion will be stronger when the material compositions are closer. In order to further enhance the adhesion between the first adhesive layer 202 and the first device layer 102, the concentrations of components in the first adhesive layer 202 can be gradually changed with the thickness, and the material compositions on both sides of the interface between the first device layer 102 and the first adhesive layer 202 can be closer. In one embodiment, the atomic concentration of silicon in the first adhesive layer 202 is gradually changed as the thickness of the first adhesive layer 202 is increased. In other embodiments, the concentrations of other components in the first adhesive layer 202 can also be changed with the thickness according to the material of the surface of the first device layer 102. In other embodiments, the atomic concentration of each element in the first adhesive layer 202 can be consistent at positions of different thicknesses.

In order to further enhance the adhesion between the first adhesive layer 202 and the first buffer layer 203, the material compositions on both sides of the interface between the first buffer layer 203 and the first adhesive layer 202 are closer. In one embodiment, the atomic concentration of carbon in the first buffer layer 203 is gradually increased as the thickness of the first buffer layer 203 is increased. In other embodiments, the atomic concentration of carbon in the first buffer layer 203 can be gradually decreased as the thickness of the first buffer layer 203 is increased, or the atomic concentration of carbon in the first buffer layer 203 can be gradually increased first and gradually decreased later as the thickness of the first buffer layer 203 is increased. In other embodiments, the atomic concentration of each element in the first buffer layer 203 is consistent at positions of different thicknesses.

In order to further enhance the adhesion between the first buffer layer 203 and the first bonding layer 201, the concentrations of components in the first bonding layer 201 can be gradually changed with the thickness, and the material compositions on both sides of the interface between the first bonding layer 201 and the first buffer layer 203 can be closer. In one embodiment, the atomic concentration of carbon in the first bonding layer 201 is gradually increased as the thickness of the first bonding layer 201 is increased. In other embodiments, the atomic concentration of carbon in the first bonding layer 201 can be gradually decreased as the thickness of the first bonding layer 201 is increased, or the atomic concentration of carbon in the first bonding layer 201 can be gradually increased first and gradually decreased later as the thickness of the first bonding layer 201 is increased. In other embodiments, each element in the first bonding layer 201 is kept consistent at positions of different thicknesses and has uniformly distributed atomic concentration.

In order to make the first adhesive layer 202 and the first buffer layer 203 have higher densities at positions of different thicknesses, the thicknesses of the first adhesive layer 202 and the first buffer layer 203 cannot be too large. In one embodiment, the thickness of the first adhesive layer 202 is in the range from 30 Å to 100 Å, and the thickness of the first buffer layer 203 is in the range from 50 Å to 100 Å.

In some embodiments, the thickness of the first bonding layer 201 is greater than the thickness of the first adhesive layer 202 and the thickness of the first buffer layer 203. This ensures that the first bonding layer 201 has sufficient bonding thickness when the first bonding layer 201 is being bonded to other bonding layers. In one embodiment, the thickness of the first bonding layer 201 is greater than 100 Å.

In other embodiments, the first bonding layer 201 can further include two or more stacked sub-bonding layers. The materials of different sub-bonding layers may be the same or different.

FIG. 4 schematically illustrates the structure of the semiconductor structure of another embodiment of this invention.

In this embodiment, the semiconductor structure further includes the second substrate 300, the second adhesive layer 402, the second buffer layer 403, and the second bonding layer 401. The second adhesive layer 402 is formed on the surface of the second substrate 300, the second buffer layer 403 is disposed on the surface of the second adhesive layer 402, and the second bonding layer 401 is disposed on the surface of the second buffer layer 403. The second bonding layer 401 is bonded and fixed to the surface of the first bonding layer 201 correspondingly.

The second substrate 300 includes the second semiconductor substrate 301 and the second device layer 302 disposed on the surface of the second semiconductor substrate 301.

The material of the second adhesive layer 402 is the dielectric material, and the density of this material is greater than the density of the second bonding layer 401. The material of the second adhesive layer 402 can be at least one of silicon nitride, silicon oxynitride, or silicon oxide. According to the reactant gas used in the chemical vapor deposition process and the requirements of the specific product, at least one of oxygen, hydrogen, phosphorus, fluorine, or other elements may also be doped in the second adhesive layer 402.

The material of the second buffer layer 403 is the dielectric material, and the density of this material is greater than the density of the second bonding layer 401. The material of the second buffer layer 403 includes the dielectric material including carbon. In one embodiment, the second buffer layer 403 mainly includes silicon, nitrogen, and carbon. In other embodiments, the second buffer layer 403 can further be doped with at least one of silicon, nitrogen, oxygen, hydrogen, phosphorus, fluorine, etc. according to the reactant gas used in the chemical vapor deposition process and the requirements of the specific product.

The material of the second bonding layer 401 includes a dielectric material including carbon, and the atomic concentration of carbon in the second bonding layer 401 is greater than the atomic concentration of carbon in the second buffer layer 403. In one embodiment, the second bonding layer 401 mainly includes silicon, nitrogen, and carbon. In other embodiments, the second bonding layer 401 can further be doped with at least one of silicon, nitrogen, oxygen, hydrogen, phosphorus, fluorine, etc. according to the reactant gas used in the chemical vapor deposition process and the requirements of the specific product. Since the atomic concentration of carbon in the second buffer layer 403 is less than the atomic concentration of carbon in the second bonding layer 401, the higher adhesion between the second buffer layer 403 and the second adhesive layer 402 can be obtained.

The specific materials and structures of the second adhesive layer 402, the second buffer layer 403, and the second bonding layer 401 can be known by referring to the description of the first adhesive layer 202, the first buffer layer 203, and the first bonding layer 201 in the above embodiments, and will not be repeated here. In one embodiment, the materials and structures of the second adhesive layer 402 and the first adhesive layer 202 are the same, the materials and structures of the second buffer layer 403 and the first buffer layer 203 are the same, and the materials and structures of the second bonding layer 401 and the first bonding layer 201 are the same. In one embodiment, the thickness of the second adhesive layer 402 is in the range from 30 Å to 100 Å and the thickness of the second bonding layer 401 is greater than 100 Å.

The second bonding layer 401 and the first bonding layer 201 both include carbon. Therefore, more silicon-oxygen bonds can be formed on the bonding interface, and the stronger bonding force can be formed as well. In one embodiment, the bonding force between the second bonding layer 401 and the first bonding layer 201 is greater than 1.7 J/M2.

In other embodiments, the semiconductor structure may include three or more substrates, and the adjacent substrates are bonded by the adhesive layer and the bonding layer in the embodiments of this invention.

FIG. 5 schematically illustrates the structure of the semiconductor structure of another embodiment of this invention.

In this embodiment, the semiconductor structure further includes the first bonding pads 501 penetrating through the first bonding layer 201, the first buffer layer 203, and the first adhesive layer 202 and the second bonding pads 502 penetrating through the second bonding layer 401, the second buffer layer 403, and the second adhesive layer 402. The surface of the second bonding layer 401 is bonded and fixed to the surface of the first bonding layer 201 correspondingly, and the first bonding pads 501 are bonded to the second bonding pads 502 correspondingly.

The first bonding pads 501 and the second bonding pads 502 can be respectively connected to the semiconductor devices and the metal interconnection structures in the first device layer 102 and the second device layer 302.

The materials of the first bonding pads 501 and the second bonding pads 502 may be copper, tungsten, or other metallic materials. The first bonding layer 201 and the second bonding layer 401 include carbon, which is capable of effectively blocking the diffusion of the materials of the first bonding pads 501 and the second bonding pads 502 at the bonding interface, thereby improving the performance of the semiconductor structure.

Referring to FIG. 6, in one embodiment of this invention, the semiconductor structure further includes the third substrate 600, the third adhesive layer 702 disposed on the surface at one side of the third substrate 600, the third buffer layer 703 disposed on the surface of the third adhesive layer 702, and the third bonding layer 701 disposed on the surface of the third buffer layer 703. Additionally, the semiconductor structure further includes the fourth adhesive layer 802 disposed on the opposite surface of another side of the third substrate 600, the fourth buffer layer 803 disposed on the surface of the fourth adhesive layer 802, and the fourth bonding layer 801 disposed on the surface of the fourth buffer layer 803. The third bonding layer 701 is bonded and fixed to the surface of the first bonding layer 201 correspondingly, and the fourth bonding layer 801 is bonded and fixed to the surface of the second bonding layer 401 correspondingly to form the three-layer bonded structure.

The materials and structures of the third adhesive layer 702 and the fourth adhesive layer 802, the materials and the structures of the third buffer layer 703 and the fourth buffer layer 803, and the materials and the structures of the third bonding layer 701 and the fourth bonding layer 801 can be known by referring to the materials and the structures of the first adhesive layer 202, the first buffer layer 203, and the first bonding layer 201 in the aforementioned embodiments. These materials and structures will not be described herein.

In this embodiment, the semiconductor structure further includes the third bonding pads 704 penetrating through the third bonding layer 701, the third buffer layer 703, and the third adhesive layer 702 and the fourth bonding pads 804 penetrating through the fourth bonding layer 801, the fourth buffer layer 803, and the fourth adhesive layer 802. The third bonding pads 704 are bonded and connected to the first bonding pads 501, and the fourth bonding pads 804 are bonded and connected to the second bonding pads 502.

In other embodiments, the semiconductor structure may also include a bonded structure including four or more layers.

The above description is only related to the preferred embodiments of this invention. It should be noted that several improvements and modifications can be made without departing from the principles of this invention for those skilled in the art. These improvements and modifications should also be considered as the scope of protection of this invention.

What is claimed is:

1. A semiconductor structure, comprising:
   a first substrate;
   a first adhesive layer disposed on a surface of the first substrate;
   a first buffer layer disposed on a surface of the first adhesive layer; and
   a first bonding layer disposed on a surface of the first buffer layer, wherein the first bonding layer is directly in contact with the surface of the first buffer layer, and a density of the first adhesive layer and a density of the first buffer layer are both greater than a density of the first bonding layer,
   wherein a material of the first bonding layer and a material of the first buffer layer comprise a dielectric material comprising carbon (C), and an atomic concentration of carbon in the first bonding layer is greater than an atomic concentration of carbon in the first buffer layer.

2. The semiconductor structure of claim 1, wherein the atomic concentration of carbon in the first bonding layer is greater than 35%, and the atomic concentration of carbon in the first buffer layer is in a range from 0% to 50%.

3. The semiconductor structure of claim 1, wherein the atomic concentration of carbon in the first bonding layer is increased as a thickness of the first bonding layer is increased, and the atomic concentration of carbon in the first buffer layer is increased as a thickness of the first buffer layer is increased.

4. The semiconductor structure of claim 1, wherein a material of the first adhesive layer comprises at least one of silicon nitride, silicon oxynitride, or silicon oxide.

5. The semiconductor structure of claim 1, wherein the material of the first bonding layer further comprises silicon (Si) and nitrogen (N).

6. The semiconductor structure of claim 1, wherein the material of the first buffer layer further comprises silicon and nitrogen.

7. The semiconductor structure of claim 1, wherein a thickness of the first adhesive layer is in a range from 30 angstroms (Å) to 100 angstroms, and a thickness of the first buffer layer is in a range from 50 angstroms to 100 angstroms.

8. The semiconductor structure of claim 1, further comprising:
   a second substrate;
   a second adhesive layer formed on a surface of the second substrate;
   a second buffer layer disposed on a surface of the second adhesive layer; and
   a second bonding layer disposed on a surface of the second buffer layer, wherein a density of the second adhesive layer and a density of the second buffer layer are both greater than a density of the second bonding layer, and the second bonding layer is bonded and fixed to a surface of the first bonding layer correspondingly.

9. The semiconductor structure of claim 8, wherein a material of the second bonding layer and a material of the first bonding layer are the same, a material of the second buffer layer and a material of the first buffer layer are the same, and a material of the second adhesive layer and a material of the first adhesive layer are the same.

10. The semiconductor structure of claim 8, further comprising:
    a plurality of first bonding pads penetrating through the first bonding layer, the first buffer layer, and the first adhesive layer; and
    a plurality of second bonding pads penetrating through the second bonding layer, the second buffer layer, and the second adhesive layer, wherein the first bonding pads are bonded to the second bonding pads correspondingly.

11. A method of forming a semiconductor structure, comprising:
    providing a first substrate;
    forming a first adhesive layer on a surface of the first substrate;

performing a plasma bombardment process on the first adhesive layer to increase a density of the first adhesive layer;

forming a first buffer layer on a surface of the first adhesive layer; and forming a first bonding layer on a surface of the first buffer layer, wherein the density of the first adhesive layer and a density of the first buffer layer are both greater than a density of the first bonding layer, wherein the first adhesive layer includes a plurality of hydrogen bonds before performing the plasma bombardment process, and a nitrogen-containing plasma is used in the plasma bombardment process to reduce the hydrogen bonds in the first adhesive layer.

12. The method of forming the semiconductor structure of claim 11, wherein a material of the first bonding layer and a material of the first buffer layer comprise a dielectric material including carbon, and an atomic concentration of carbon in the first bonding layer is greater than an atomic concentration of carbon in the first buffer layer.

13. The method of forming the semiconductor structure of claim 12, wherein the material of the first bonding layer further comprises silicon and nitrogen.

14. The method of forming the semiconductor structure of claim 12, wherein the material of the first buffer layer further comprises silicon and nitrogen.

15. The method of forming the semiconductor structure of claim 11, wherein a material of the first adhesive layer comprises at least one of silicon nitride, silicon oxynitride, or silicon oxide.

16. The method of forming the semiconductor structure of claim 11, wherein a thickness of the first adhesive layer is in a range from 30 angstroms to 100 angstroms, and a thickness of the first buffer layer is in a range from 50 angstroms to 100 angstroms.

* * * * *